United States Patent
Tsai et al.

(10) Patent No.: US 6,232,164 B1
(45) Date of Patent: May 15, 2001

(54) PROCESS OF MAKING CMOS DEVICE STRUCTURE HAVING AN ANTI-SCE BLOCK IMPLANT

(75) Inventors: Chaochieh Tsai, Taichung; Kuan-Yao Wang, Tainan, both of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/312,544

(22) Filed: May 24, 1999

(51) Int. Cl.[7] .................................................. H01L 21/336
(52) U.S. Cl. .......................... 438/217; 438/231; 438/291; 438/305
(58) Field of Search ...................... 438/217, 231, 438/291, 305, FOR 191, FOR 188

(56) References Cited

U.S. PATENT DOCUMENTS

| | | |
|---|---|---|
| 4,011,105 | 3/1977 | Paivinen et al. . |
| 5,270,234 * | 12/1993 | Huang et al. . |
| 5,399,508 | 3/1995 | Nowak . |
| 5,429,956 * | 7/1995 | Shell et al. . |
| 5,434,093 | 7/1995 | Chau et al. . |
| 5,489,543 | 2/1996 | Hong . |
| 5,550,074 | 8/1996 | Lin . |
| 5,576,574 * | 11/1996 | Hong . |
| 5,766,998 | 6/1998 | Tseng . |
| 5,773,348 * | 6/1998 | Wu . |
| 5,869,374 * | 2/1999 | Wu . |
| 6,005,285 * | 12/1999 | Gardner et al. . |
| 6,025,635 * | 2/2000 | Krivokapic . |

* cited by examiner

Primary Examiner—George Fourson
(74) Attorney, Agent, or Firm—George O. Saile; Stephen B. Ackerman; William J. Stoffel

(57) ABSTRACT

A method of fabricating a CMOS device having (1) an anti-SCE block region below a channel region and (2) a metal gate. The invention uses a masking layer having an opening to define the anti-SCE block implant and also the gate structure. The method comprises forming a masking layer having a first opening defining a channel region over the substrate. In a key step, performing an Anti-SCE block implant to create an anti-SCE region. Next, a forming a gate dielectric layer is formed on the substrate in the first opening. A conductive layer is formed over the substrate in the channel region and over the masking layer. The conductive layer is planarized to form a metal gate metal. The barrier layer is removed. LDD regions are formed. Spacers are formed on the sidewall of the metal gate. Source/Drain regions are implanted adjacent to the metal gate stack.

21 Claims, 5 Drawing Sheets

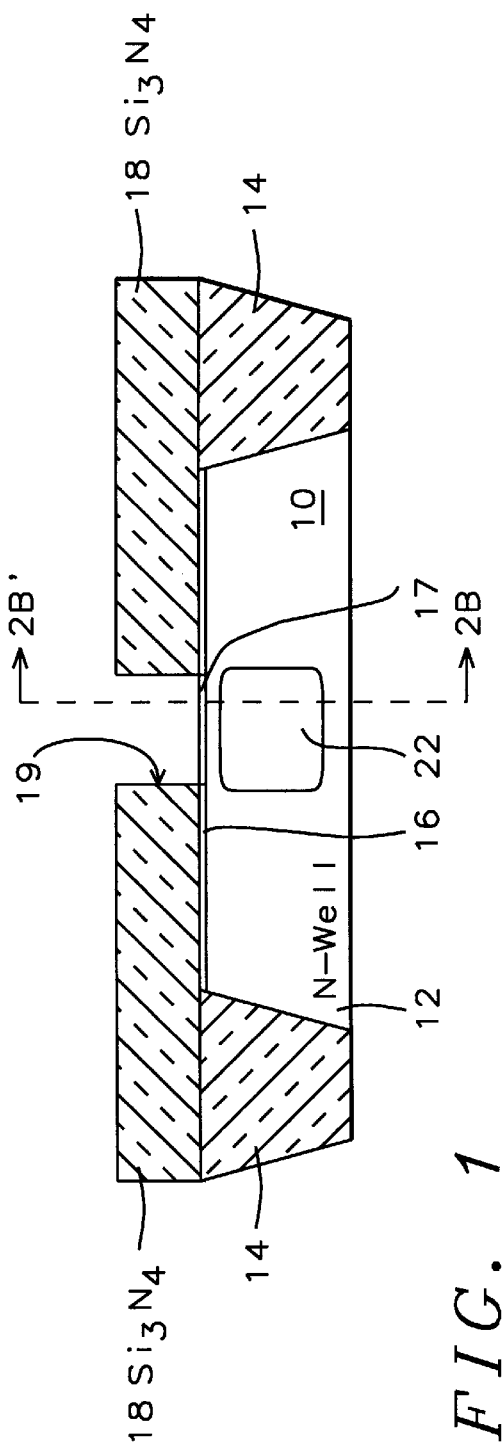
FIG. 1
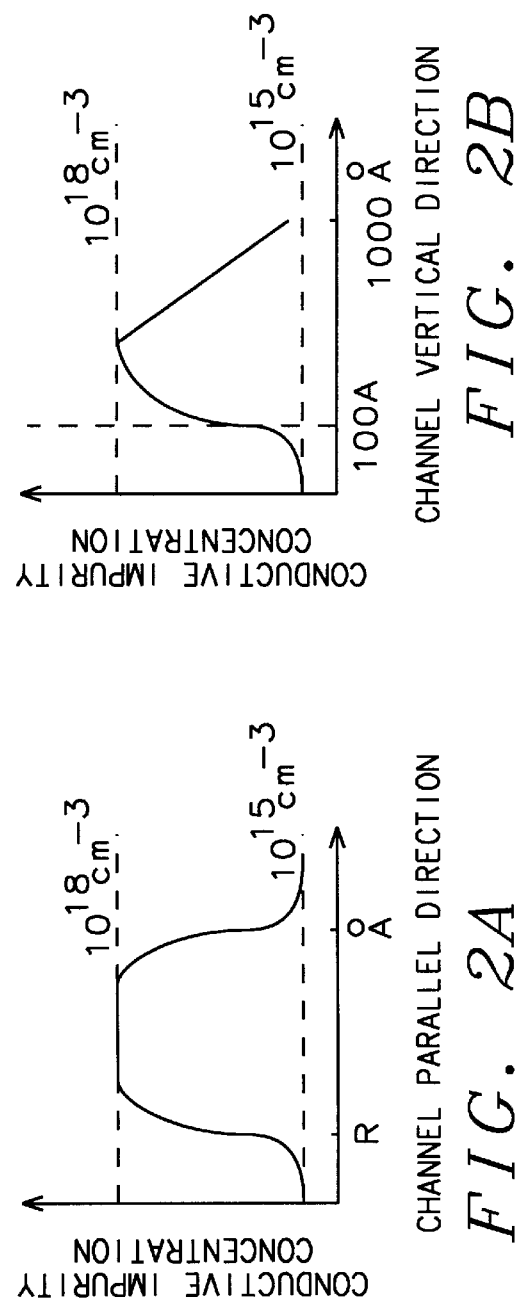
FIG. 2A
FIG. 2B

PROCESS OF MAKING CMOS DEVICE STRUCTURE HAVING AN ANTI-SCE BLOCK IMPLANT

BACKGROUND OF INVENTION

1) Field of the Invention

This invention relates generally to fabrication of a MOS semiconductor devices and more particularly to a method of forming a MOS device having a localized anti-Short Channel Effect (SCE) block region (e.g., anti-punchthrough region) which is not in contact with the source/drain regions to reduce parasitic Junction capacitance.

2) Description of the Prior Art

Metal-Oxide-Silicon (MOS) transistors such as Field Effect Transistors, MOSFETs, are well known in the art. Such devices are typically formed having a source region and a drain region, of similar conductivity type, separated by a channel region, of a differing conductivity type, capped with a conductive gate. The gate to source voltage controls the passage of current through the channel between the source and the drain regions. In typical n-channel operation, a positive voltage is applied between the drain and the source with the source grounded to a reference potential. Due to the differing conductivity type of the channel separating the source and the drain, usually no current flows between the source and drain. However, if a sufficiently large voltage is applied between the gate and source, the conductivity in the channel region will increase, thereby allowing current to flow between the source and the drain. The gate voltage required to induce the flow of current between the drain and the source is referred to as the threshold voltage.

Under certain circumstances, however, unwanted current flow may occur between the source and the drain even when no voltage is applied to the gate. Such a condition may be due to avalanche breakdown or punchthrough. Punchthrough occurs when the MOS transistor is biased in an off state with the gate and the source both at approximately zero volts with respect to ground, but with the drain at a voltage as high as 5 volts. Even though no flow of current is desired, drain current may still occur regardless of the zero gate voltage. This is due to the fact that under such conditions, the normal doping concentration of the channel region is not sufficient to prevent current flow between the source and drain regions.

In order to eliminate punchthrough currents, the doping concentration in the substrate of the MOS device is raised. A high energy or so-called "punchthrough" implant is used to locally raise the doping concentration of the MOS device substrate. Typically, the "punchthrough" implant is made as a blanket implant over the active region of the MOS device. Unfortunately, the punchthrough implant also raises the doping concentration of the substrate in the source and drain region. As a consequence of the increased doping concentration, the source-drain junction capacitance is also increased.

Furthermore, MOS semiconductor transistors, such as MOSFETs, often experience current leakage and other problems due to short channel lengths. The short channel, which occurs as a consequence of difficult to control manufacturing processes, results in closely spaced source and drain regions. Due to the close proximity of the source to the drain, current leakage or other "short channel" effects may hamper the performance of the semiconductor device.

Consequently, a need exists to prevent punchthrough effects in semiconductor devices such as MOSFETs using a high energy or punchthrough implant without substantially increasing source-drain junction capacitance, and which minimizes short channels effects.

The importance of overcoming the various deficiencies noted above is evidenced by the extensive technological development directed to the subject, as documented by the relevant patent and technical literature. The closest and apparently more relevant technical developments in the patent literature can be gleaned by considering U.S. Pat. No. 5,399,508 (Nowak) Method for self-aligned punchthrough implant using an etch-back gate—shows a anti-punchthru process. See Nowak, FIGS. 1D–1F and Col. 4.

U.S. Pat. No. 5,489,543 (Hong) shows a method of forming an anti-punchthru region by implanting through a polysilicon layer 24.

U.S. Pat. No. 5,270,234 (Huang) Deep submicron transistor fabrication method—shows a method of forming an anti-punchthru region 220 by forming spacers 65 55 on the sidewalls of a masking layer 40.

U.S. Pat. No. 5,434,093 (Chau) Inverted spacer transistor—teaches a method for forming narrow length transistors by an inverse spacer process.

U.S. Pat. No. 4,011,105 (Paivinen): Field inversion control for N-channel device integrated circuits—discloses another method of forming a P region under the gate of a NMOS TX. U.S. Pat. No. 5,550,074 (Lin) shows a method of forming an anti-punchthru region by a separate masking process.

However, there is still a need for further reduction of the SCE.

SUMMARY OF THE INVENTION

It is an object of the present invention to provide a method for fabricating a MOS transistor having an Anti-SCE block region that reduces the Short Channel Effect (SCE).

It is an object of the present invention to provide a method for fabricating a MOS transistor having an Anti-SCE block that reduces the Short Channel Effect (SCE) and a method for forming a metal gate.

It is another object of the invention to form a high dose Anti-SEC that does not directly contact (or overlap) S/D regions thereby the parasitic junction capacitance can be reduced and the device speed can be reduced.

It is another object of the invention to form an Anti-SCE region under a metal gate.

To accomplish the above objectives, the present invention provides a method of manufacturing a MOS transistor having an anti-punchthru region (or Anti-SCE block) formed by a self-aligned ion implant (I/I) that reduces the SCE. The method begins by forming isolation regions in the substrate defining active regions. Next, we form a sacrificial oxide layer over the active areas. A masking layer is then formed over the substrate. The masking layer is formed having a first opening defining a channel region in the substrate. Following this we perform Anti-SCE block implant through the first opening to create an anti-SCE region doped with a first conductivity type impurity. The sacrificial oxide in first opening is removed. The, we form a gate dielectric layer on the substrate in the first opening. A gate is formed over the gate dielectric layer. The gate is planarized stopping on the masking layer. The masking layer is dielectric layer. The gate is planarized stopping on the masking layer. The masking layer is removed. A LDD Implant is performed by implanting ions into the substrate in the active areas adjacent to the metal gate stack to form LDD regions doped with ions having a second conductivity type doping. A spacer is formed on the sidewall of the gate. We next perform a S/D implant to form Source/Drain regions adjacent to the metal gate stack. The source/drain regions have a second conductivity type doping.

The invention provides the following benefits:

lowers the gate resistance by forming a metal gate the anti-SCE block region lowers the junction capacitance the anti-SCE block region reduces the Short channel effect (SCE)

the anti-SCE block region reduces the hot carrier effect.

The present invention achieves these benefits in the context of known process technology. However, a further understanding of the nature and advantages of the present invention may be realized by reference to the latter portions of the specification and attached drawings.

Additional objects and advantages of the invention will be set forth in the description that follows, and in part will be obvious from the description, or may be learned by practice of the invention. The objects and advantages of the invention may be realized and obtained by means of instrumentalities and combinations particularly pointed out in the append claims.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which:

FIGS. 1, 3, 4, 5, 6, and 7 are cross sectional views for illustrating a method for manufacturing a MOS device having an anti-SCE block region 22 according to the present invention.

FIGS. 2A and 2B are concentration profiles for the invention's SCE region 22 formed according to the present invention. FIG. 2B is taken along axis 2B/2B' in FIG. 1.

FIG. 8B is taken along axis 2B/2B' in FIG. 1.

FIGS. 9A and 9B are concentration profiles comparing the invention's SCE region with the U.S. Pat. No. 5,399,508 (Nowak)'s anti-punchthru region profile. FIG. 9A is a concentration profile of the invention's SCE region. FIG. 9B is a concentration profile of the U.S. Pat. No. 5,399,508 (Nowak)'s anti-punchthru region.

DETAILED DESCRIPTION OF THE PREFERRED EMBODIMENTS

Figure 3:
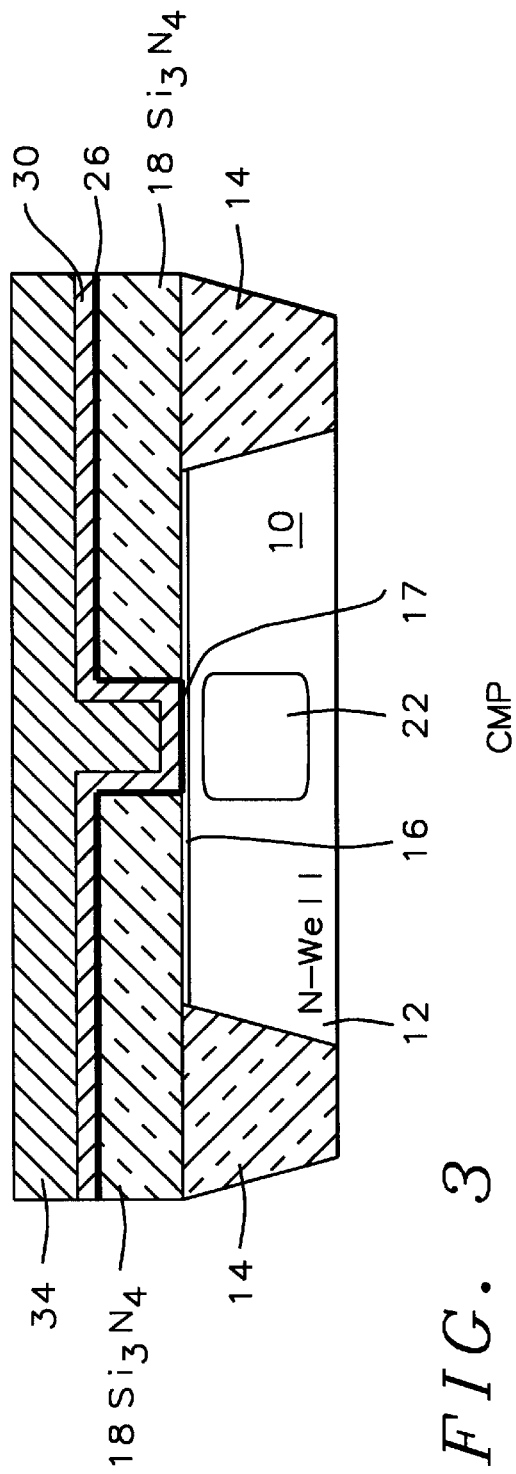

The present invention will be described in detail with reference to the accompanying drawings. The present invention provides a method of forming a MOS transistor (1) having a anti-punchthrough region 22 (Anti-Short Channel Effect (SCE) block) and (2) having a metal gate.

In the following description numerous specific details are set forth such as flow rates, pressure settings, thicknesses, etc., in order to provide a more thorough understanding of the present invention. It will be obvious, however, to one skilled in the art that the present invention may be practiced without these details. In other instances, well known process have not been described in detail in order to not unnecessarily obscure the present invention.

The description below illustrates a preferred embodiment of the invention as a PMOS devices. Alternatively, a NMOS device can be formed having the invention's anti-SCE block region 22 by reversing the conductivity types of the dopants as is known to those skilled in the art.

FIG. 1 shows the step of forming shallow trench isolation (STI) regions 14 in the substrate defining active regions. The active regions are the areas on the substrate where devices will be formed.

Substrate 10 is understood to possibly include a semiconductor wafer, active and passive devices formed within the wafer and layers formed on the wafer surface.

Next, we form a sacrificial oxide layer 16 over the active areas. The sacrifical oxide layer preferably has a thickness of between about 80 and 160 Å.

Following this we perform a n-type retrograde well ion implant (I/I) thereby forming a n-well 12 in the active area. The N-well preferably has a N impurity concentration between about 1E15 and 1E17 atoms/cm$^3$ and a depth in a range of between about 0.5 and 1.0 $\mu$m.

A masking layer 18 is formed over the substrate. The masking layer is preferably composed of silicon nitride, polysilicon, or oxide and is most preferably composed of silicon nitride (SiN) and preferably has a thickness of between about 2000 and 3000 Å. The masking layer 18 is patterned to form a first opening 19 defining a channel region in the substrate.

The first opening 19 preferably has a width of below 0.13 $\mu$m and more preferably in a range of between about 0.9 and 0.13 $\mu$m. The small channel length <0.13 $\mu$m suffers severe Short Channel Effect (SCE) without any treatment. The inventor's recognition of this problem is important to the invention.

In a critical step, we perform an Anti-SCE block implant to create an anti-Short channel effect (anti-SCE) block region (or an anti-punchthrough region) 22. The (anti-SCE) block region 22 is also functions as an anti-punchthrough region.

The anti-SCE region 22 reduces the Short Channel Effect (SCE) because the high dose in the anti-SCE bottom will stop the depletion coming from LDD and drain regions.

FIGS. 2a and 2b show concentration profiles of the PMOS devices and PMOS anti-SCE blocking region 22. FIG. 2B is taken along axis 2B/2B' in FIG. 1. The anti-SCE region 22 preferably starts at a depth between 80 and 120 Å (tgt=100 Å) and ends a bottom depth between 1000 and 2000 Å. The anti-SCE region 22 preferably has a peak concentration between 1.5E17 and 1.5E18 atoms/cm$^3$. For PMOS devices, the anti-SCE region is n-typed doped. For NMOS devices, the anti-SCE regions are P-type doped.

For the PMOS devices, the preferred Anti-SCE implant process is: Arsenic ions implanted, at an energy between 70 and 90 Kev, a dose between 12E13 and 2E13 ions/sq cm.

For the current technology and dimensions, the invention's SCE regions has the following concentrations: (See FIG. 2B)

TABLE preferred concentrations (atom/cc) of the invention's
Anti-SCE region (See FIG. 2B.)

| Depth | Low | target | High |
|---|---|---|---|
| 100 Å (75 Å to 200 Å) | 0.5 E 15 | 1E15 | 1.5 E 15 |
| 500 Å (400 to 600 Å) | 0.5 E 18 | 1E18 | 1.5 E 18 |
| 1000 Å (900 to 2100 Å) | 0.5 E 15 | 1E15 | 1.5 E 15 |

Concentrations in Atoms/cc.

Figure 8A:
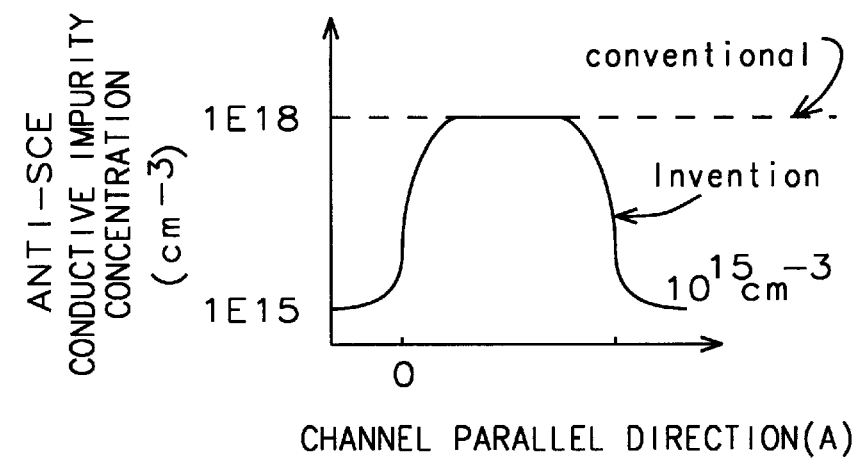
FIGS. 8A and 8B are concentration profiles comparing the invention's SCE region with the inventor's previous anti-punchthru region profile.
Figure 8B:
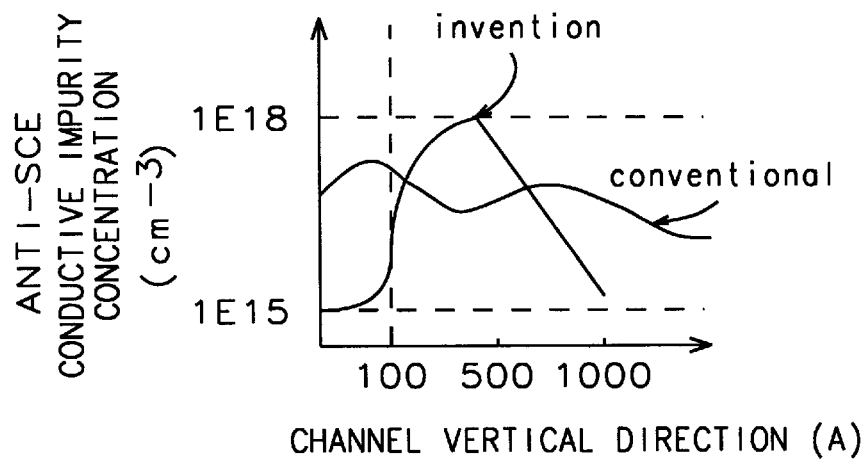

The anti-SCE region 22 profile shown in FIG. 8B preferably has a parabolic shape between 100 Å and 500 Å and a linear shape between 500 Å and 1000 Å.

FIGS. 8A and 8B show comparisons between the invention's SCE and the inventor's previous anti-punchthrough process (labeled conventional). Notice the differences in the concentration profiles. FIG. 8B is taken along axis 2B/2B' in FIG. 1.

Figure 10:
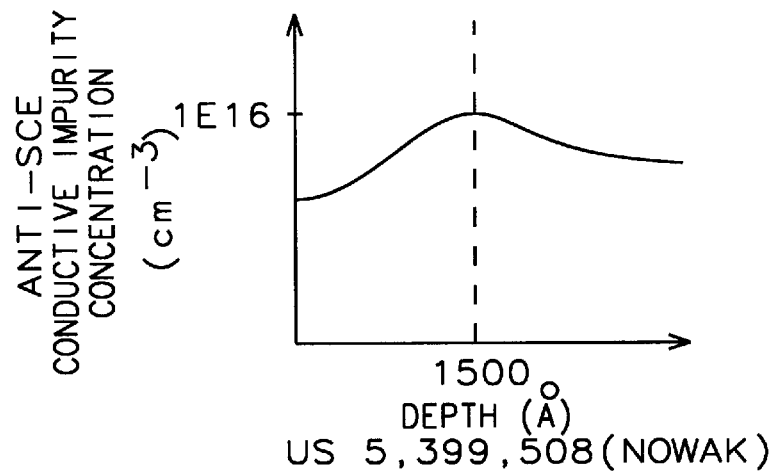
FIG. 10 is a concentration profile of the invention's Vt region.
Figure 10:
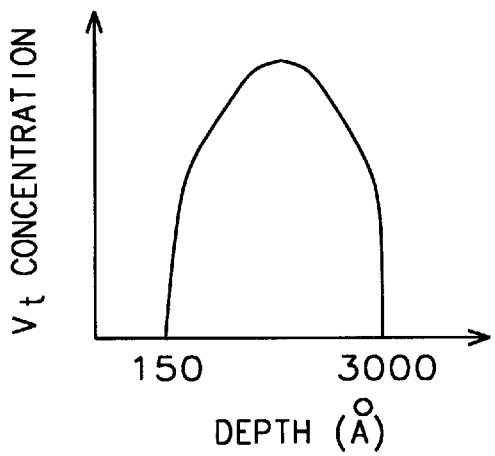

Next, we perform a Vt implant by implanting (P-type) ions (e.g., Sb (antimony) ions) into the active area starting at a top depth in a range of between about 150 and 300 Å and ending at a bottom depth between about 1000 and 3000 Å. The Vt region (not shown in the FIGS) preferably has a B concentration in a range of between about 1E16 and 1E17 atoms/cm$^3$. FIG. 10 shows the invention's Vt concentration profile.

Next, the sacrificial oxide 16 is removed from the substrate in first opening 19 preferably using an wet etch.

As shown in FIG. 3, we now form a gate dielectric layer 17 on the substrate in the first opening 19. The gate dielectric layer 17 can be composed of several materials.

The gate dielectric layer 17 is preferably composed of oxide ($SiO_2$) with thickness of between about 25 to 40 Å. Alternately, the gate dielectric layer 17 can be composed of silicon oxynitride with a thickness of between about 30 and 50 Å. Also, the gate dielectric layer 17 can be composed of silicon nitride having thickness of between about 30 and 50 Å.

Next, a gate is formed over the channel region. Below is a preferred embodiment of a metal layer formed by a planarization process.

A glue layer 26 is formed over substrate in the channel region in the first opening 19 and over the masking layer 18. The glue layer is preferably composed of Ti and has a thickness of between about 50 and 100 Å.

Still referring to FIG. 3, we form a barrier layer 30 over the glue layer 26. The barrier layer 20 composed of TiN or TiW. The barrier layer preferably has a thickness of between about 100 and 200 Å.

A metal gate stack layer 34 is formed over the barrier layer 30. The metal gate stack layer 34 is preferably composed of W with a thickness of between about 1800 and 2000 Å.

Figure 4:
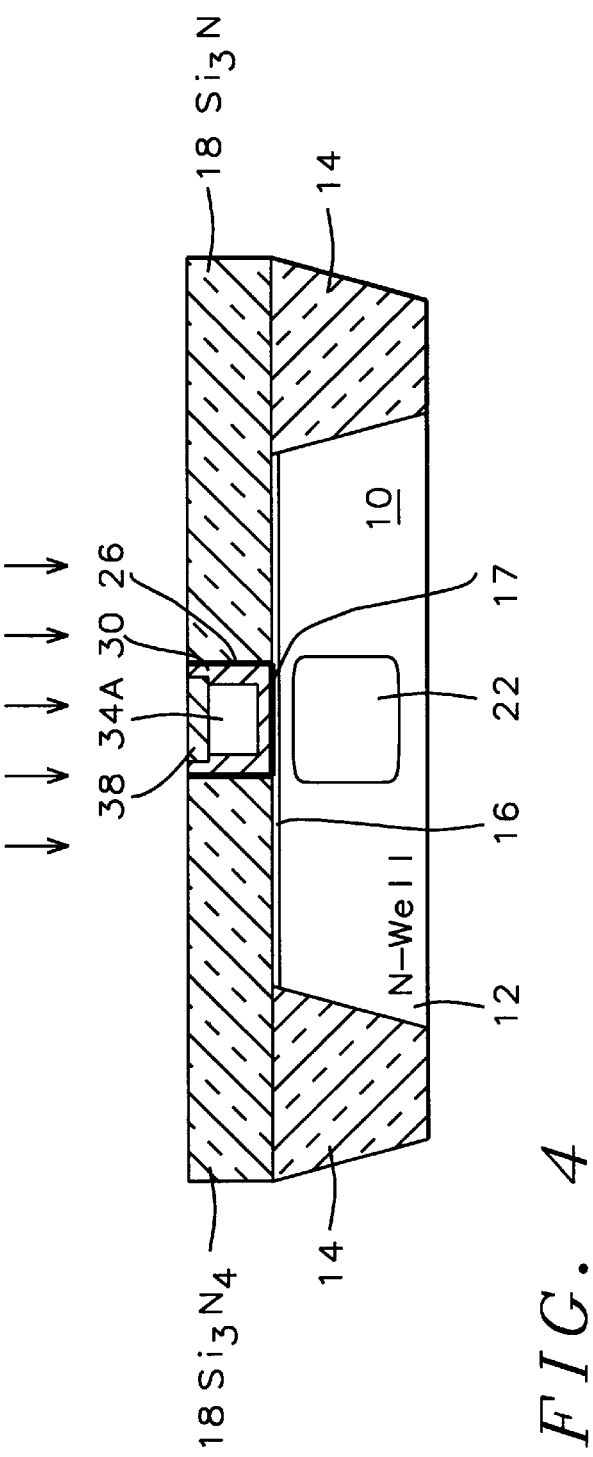

FIG. 4 shows the step of chemical-mechanical polishing the metal gate stack layer 34 stopping on the masking layer 18 to form a metal gate stack 34A.

A protection cap layer 38 is formed on the metal gate stack 34A. The protection cap layer 38 is preferably formed by a oxygen plasma treatment to create the protection cap layer 38 composed of tungsten oxide. Alternately, the protection cap layer 38 is formed by depositing a dielectric layer composed of silicon oxide, or oxynitride and chemical-mechanical polishing the dielectric layer.

Figure 5:
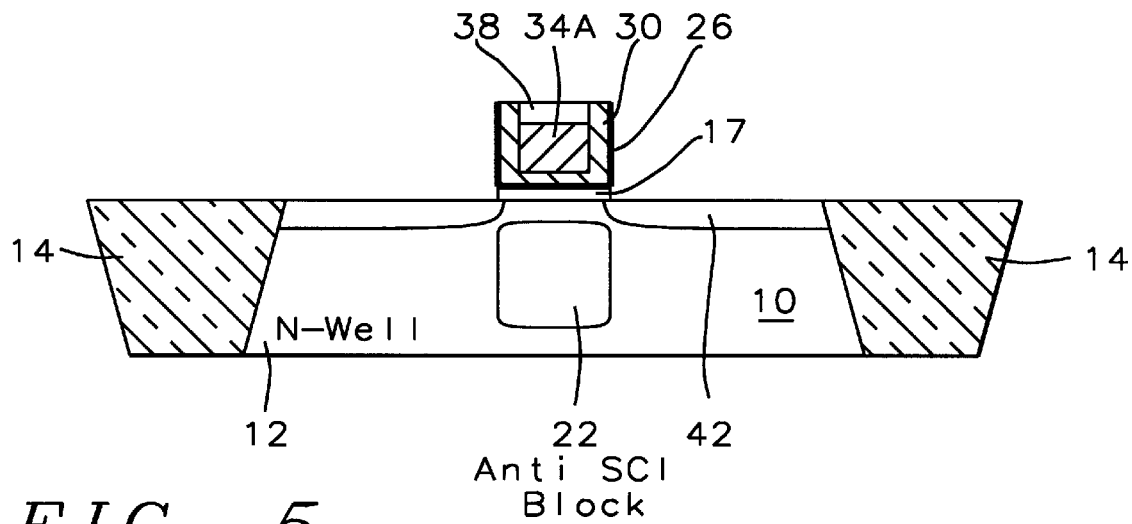

FIG. 5 illustrates the step of removing the barrier layer 18. The barrier layer is preferably removed using a hot $H_3PO_4$ etch or a dry reactive ion etch.

Next, we perform a LDD Implant by preferably implanting $BF_2$ ions into the substrate in the active areas adjacent to the metal gate stack 34A to form LDD regions 42.

The invention's LDD implant is performed at a higher than conventional dose to so that the LDD regions are HDD regions (high doped drains/sources) (HDD).

The LDD (HDD) implant is performed by implanting $BF_2$ ions at an energy between about 20 and 30 Kev with a dose between about 3E13 and 7E13 at/cm$^2$. (In contrast Conventional LDD dose is between 6E12 and 1E13 at/cm$^2$). The LDD regions 42 preferably have a depth in a range of between about 0.04 and 0.06 µm.

The invention's high dose LDD regions 42 have reduce the LDD parasitic resistance and increase Idsat.

Figure 6:
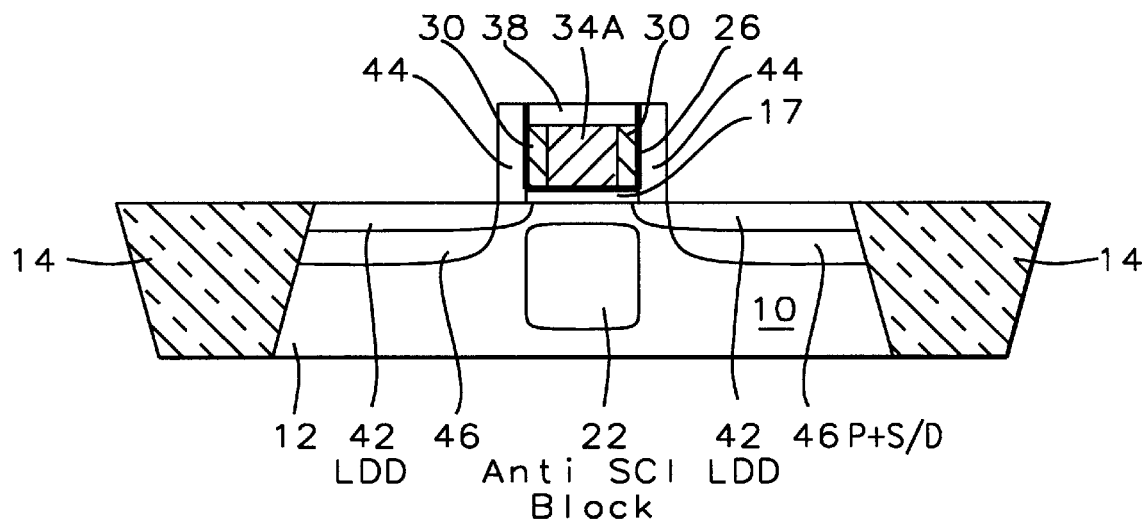

FIG. 6 shows the next step of forming a spacer 44 on the sidewall of the metal gate stack 34A.

Next we perform a S/D implant to form Source/Drain regions adjacent to the metal gate stack 34A.

The S/D implant is preferably performed by implanting $BF_2$ ions at an energy in a range of between about 40 Kev and 50 eV and a dose in a range of between about 5E15 and 6E15 atoms/cm$^2$. The Source/Drain regions 46 preferably have a depth in a range of between about 0.1 and 0.15 µm.

Figure 7:
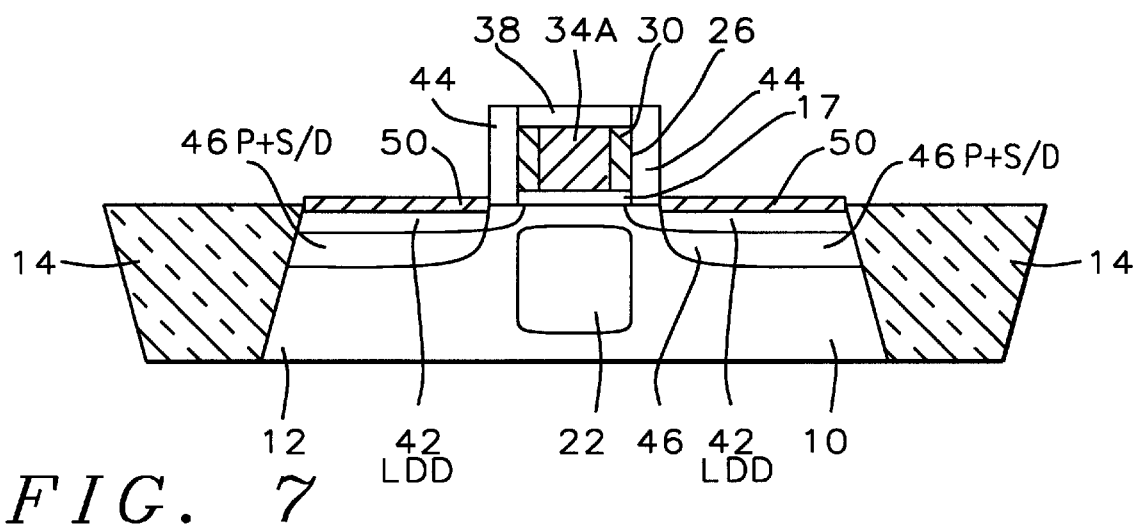

FIG. 7 shows the next step of forming silicide contacts 50 on the S/D regions 46.

Next, an interlevel dielectric (ILD) layer is formed over the substrate. Next, the FET devices (PMOS and NMOS else where on the substrate) are completed by conventional processes by forming contacts and interconnections with conductive layers that are separated by insulating layers.

The description above illustrates a preferred embodiment of the invention as PMOS devices. Alternatively, NMOS device can be formed having the invention's anti-SCE block region 22 by reversing the conductivity types of the dopants as is known to those skilled in the art. The dopant profiles (and concentrations) shown in the figs for P MOS devices (n-type anti-SCE region) are the same as for the NMOS devices with the exception that the impurities are P-type. That is NMOS FETs get a p-type dopant I/I to form the anti-SCE region.

Figure 9A:
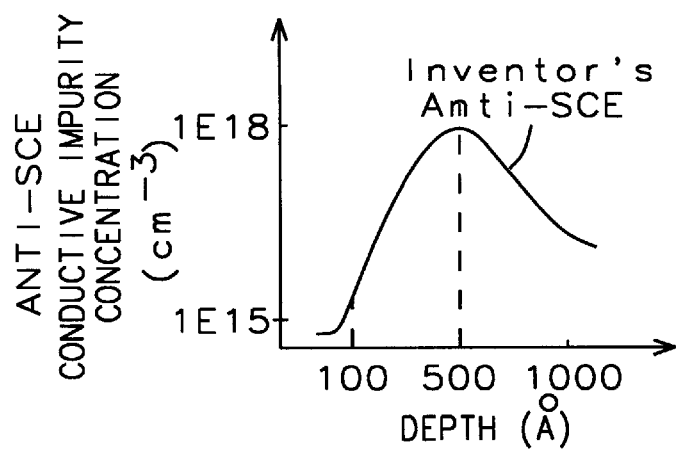

FIGS. 9A and 9B are concentration profiles comparing the invention's SCE region with the U.S. Pat. No. 5,399,508 (Nowak)'s anti-punchthru region profile. FIG. 9A is a concentration profile of the invention's SCE region. FIG. 9B is a concentration profile for U.S. Pat. No. 5,399,508 (Nowak)'s anti-punchthru region profile.

FIG. 10 shows the invention's Vt region profile.

The invention provides the following benefits:
the anti-SCE block region 22 lowers the junction capacitance
the anti-SCE block region 22 reduces the SCE.
the anti-SCE block region 22 reduces the hot carrier effect. The channel surface concentration is ~1E15 atoms/cm$^3$. Therefore voltage drops near LDD will be very gradual. Electrical peak will be low and hot carrier after is reduced.
lowers the gate resistance by forming a metal gate
The poly photolithography difficulty to the non-planar in conventional process can be relaxed.

In contrast with conventional anti-punch thru regions, the invention's anti-SCE region is channel engineered vertically to increase carrier mobility in the channel and also reduce hot carrier effects.

The combination of the metal gate and anti-SCE region gives an unexpected reduction in hot carrier effects and reduced junction capacitance.

TABLE

The Key important features/steps in the invention

| FIG. | Reason step is important |
|---|---|
| 1 | 1. Open self aligned anto-SEC implant window to allow very high does 1E18 ions/cm2 region at anti-SC bottom to reflectively stop draing Side depletion and Reduce SCE. |
| 6 | 2. anti-SCE region (1E18 cm$^{-3}$) region does not touch S/D regions or HDD, therefor the band to band junction leakage can be controlled. |
| 4 | 3. Define metal/poly gate in the planar surface increases device gate definition process window. |

It should be recognized that many publications describe the details of common techniques used in the fabrication process of integrated circuit components. Those techniques can be generally employed in the fabrication of the structure of the present invention. Moreover, the individual steps of such a process can be performed using commercially available integrated circuit fabrication machines. As specifically necessary to an understanding of the present invention, exemplary technical data are set forth based upon current technology. Future developments in the art may call for appropriate adjustments as would be obvious to one skilled in the art.

While the invention has been particularly shown and described with reference to the preferred embodiments thereof, it will be understood by those skilled in the art that various changes in form and details may be made without departing from the spirit and scope of the invention.

What is claimed is:

1. A method of fabricating a CMOS device having an anti-short channel effect (anti-SCE) region below a channel region of said CMOS device; comprising the steps of:
    a) forming isolation regions in said substrate defining active regions;
    b) forming a sacrificial oxide layer over said active areas;
    c) forming a masking layer over said substrate; said masking layer having a first opening defining a channel region in said substrate; said first opening has a width between 0.9 and 0.13 $\mu$m;
    d) performing an Anti-SCE block implant through said first opening to create an anti-SCE region doped with a first conductivity type impurity; said anti-SCE region has a concentration profile: at a depth between 75 and 200 Å, a concentration between 0.5E15 to 1.5E15 atoms/cm$^3$, at a depth between 400 and 600 Å, a concentration between 0.5E18 and 1.5E18 atoms/cm$^3$, and at a depth between 900 and 2100 Å a concentration between 0.5E15 and 1.5E15 atoms/cm$^3$;
    e) removing said sacrificial oxide in first opening;
    f) forming a gate dielectric layer on said substrate in said first opening;
    g) forming a gate over said gate dielectric layer;
    h) planarizing said gate stopping on said masking layer;
    i) removing said masking layer and said sacrificial layer;
    j) performing a LDD Implant by implanting ions into said substrate in said active areas adjacent to said gate to form LDD regions doped with ions having a second conductivity type doping;
    k) forming a spacer on said sidewall of said gate;
    l) performing a S/D implant to form Source/Drain regions adjacent to said gate; said source/drain regions having a second conductivity type doping.

2. The method of claim 1 wherein said first conductivity is N-type and said second conductivity type is P-type.

3. The method of claim 1 wherein said first conductivity is P-type and said second conductivity type is N-type.

4. The method of claim 1 wherein said masking layer is composed of silicon nitride having a thickness of between about 2000 and 3000 Å.

5. The method of claim 1 wherein said anti-SCE region start at a depth below the surface of said substrate between 80 and 120 Å and ending a depth between 900 and 1100 Å; and said anti-SCE region having a peak concentration at a depth between 400 and 600 Å; said anti-SCE region having a peak concentration between 0.5E18 and 1.5E18 atoms/cm$^3$.

6. The method of claim 1 wherein said gate is formed by the following steps:
    a) forming glue layer over said substrate in said channel region and over said masking layer;
    b) forming a barrier layer over said glue layer; said barrier layer composed of TiN or TiW;
    c) forming a metal gate stack layer over said barrier layer; said metal gate stack layer composed of W with a thickness of between about 1800 and 2000 Å;
    d) chemical-mechanical polishing said metal gate stack layer stopping on said masking layer to form a metal gate stack;
    e) forming a protection cap layer on said metal gate stack; said protection cap layer formed by a oxygen plasma treatment to create said protection cap layer composed of tungsten oxide; whereby said gate is comprised of said metal gate stack and said protection cap layer.

7. The method of claim 1 wherein the LDD implant performed by implanting BF$_2$ ions at an energy between about 20 and 30 Kev with a dose between about 3E13 and 7E13 atoms/cc; said LDD regions having a depth in a range of between about 0.04 and 0.06 $\mu$m.

8. The method of claim 1 wherein said S/D implant performed by implanting BF$_2$ ions at an energy in a range of between about 40 and 50 Kev; and a dose in a range of between about 5E15 and 6E15 atoms/cc; said Source/Drain regions having a depth in a range of between about 0.10 and 0.15 $\mu$m.

9. A method of fabricating a PMOS device having an anti-SCE block region below a channel region of said PMOS device; comprising the steps of:
    a) forming isolation regions in said substrate defining active regions;
    b) forming a sacrificial oxide layer over said active areas;
    c) performing a n-type retrograde well Ion implant forming a n-well in said active area;
    d) forming a masking layer over said substrate; said masking layer having a first opening defining a channel region in said substrate; said first opening has a width between 0.9 and 0.13 $\mu$m;
    e) performing an Anti-SCE block implant to create an anti-SCE region doped with a first n-type conductivity impurity; said anti-SCE region has a concentration profile: at a depth between 75 and 200 Å, a concentration between 0.5E15 to 1.5E15 atoms/cm$^3$, at a depth between 400 and 600 Å, a concentration between 0.5E18 and 1.5E18 atoms/cm$^3$, and at a depth between 900 and 2100 Å a concentration between 0.5E15 and 1.5E15 atoms/cm$^3$; and f) removing said sacrificial oxide in first opening;

g) forming a gate dielectric layer on said substrate in said first opening;

h) forming glue layer over said substrate in said channel region and over said masking layer;

i) forming a barrier layer over said glue layer;

j) forming a metal gate stack layer over said barrier layer;

k) chemical-mechanical polishing said metal gate stack layer stopping on said masking layer to form a metal gate stack;

l) forming a protection cap layer on said metal gate stack;

m) removing said barrier layer and said sacrificial layer;

n) performing a LDD Implant by implanting ions into said substrate in said active areas adjacent to said metal gate stack to form LDD regions having a second p-type conductivity doping;

o) forming a spacer on said sidewall of said metal gate stack p) performing a S/D implant to form Source/Drain regions adjacent to said metal gate stack; said source/drain regions having a second p-type conductivity doping q) forming silicide contacts on said Source/Drain regions; and r) forming an interlevel dielectric layer over said substrate.

10. The method of claim 9 wherein said masking layer is composed of silicon nitride having a thickness of between about 2000 and 3000 Å.

11. The method of claim 9 wherein said anti-SCE region starting at a depth below the substrate surface between 80 and 120 Å and ending a depth between 900 and 1100 Å; and said anti-SCE region having a peak concentration at a depth between 400 and 600 Å; said anti-SCE region having a peak concentration between 0.5E18 and 1.5E18 atoms/cm$^3$ and a minimum concentration between 1E15 and 5E15 atom/cc.

12. The method of claim 9 wherein step (e) further includes: performing a Vt implant to form a Vt region by implanting ions into said active area starting at a top depth in a range of between about 150 and 300 Å and ending at a bottom depth between about 1000 and 3000 Å; said Vt implant region having a concentration between about 1E16 and 1E17 atoms/cc.

13. The method of claim 9 wherein said glue layer is composed of Ti and has a thickness of between about 50 and 100 Å; said barrier layer is composed of TiN or TiW; said metal gate stack layer composed of W with a thickness of between about 1800 and 2000 Å.

14. The method of claim 9 wherein said protection cap layer formed by an oxygen plasma treatment to create said protection cap layer composed of tungsten oxide.

15. The method of claim 9 wherein said protection cap layer formed by depositing a dielectric layer composed of oxynitride or silicon oxide, and chemical-mechanical polishing said dielectric layer.

16. The method of claim 9 wherein the LDD implant performed by implanting BF$_2$ ions at an energy between about 20 and 30 Kev with a dose between about 3E13 and 7E13 atoms/cc; said LDD regions having a depth in a range of between about 0.04 and 0.06 μm.

17. The method of claim 9 wherein said S/D implant performed by implanting BF$_2$ ions at an energy in a range of between about 40 and 50 Kev; and a dose in a range of between about 5E15 and 6E15 atoms/cc; said Source/Drain regions having a depth in a range of between about 0.10 and 0.15 μm.

18. A method of fabricating a PMOS device having an anti-SCE block region below a channel region of said PMOS device; comprising the steps of:

a) forming isolation regions in said substrate defining active regions;

b) forming a sacrificial oxide layer over said active areas;

c) performing a n-type retrograde well Ion implant forming a n-well in said active area;

d) forming a masking layer over said substrate; said masking layer having a first opening defining a channel region in said substrate; said first opening has a width between 0.9 and 0.13 μm, e) performing an Anti-SCE block implant to create an anti-SCE region doped with a first n-type conductivity type impurity;
 (1) said anti-SCE region at a starting at a depth between 80 and 120 Å and ending a depth between 900 and 1100 Å; and said anti-SCE region having a peak concentration at a depth between 400 and 600 Å; said anti-SCE region having a peak concentration between 0.5E18 and 1.5E18 atoms/cm$^3$;
 said anti-SCE region has a concentration profile: at a depth between 75 to 200 Å, a concentration between 0.5E15 to 1.5E15 atoms/cm$^3$, at a depth between 400 and 600 Å, a concentration between –0.5E18 and 1.5E18 atoms/cm$^3$, and at a depth between 900 and 1100 Å a concentration between 0.5E15 and 1.5E15 atoms/cm$^3$;

f) performing a Vt implant to form a Vt region by implanting ions into said active area starting at a top depth in a range of between about 150 and 300 Å and ending at a bottom depth between about 1000 and 3000 Å; said Vt implant region having a concentration between about 1E16 and 1E17 atoms/cc;

g) removing said sacrificial oxide in first opening;

h) forming a gate dielectric layer on said substrate in said first opening;

i) forming glue layer over said substrate in said channel region and over said masking layer; said glue layer is composed of Ti and has a thickness of between about 50 and 100 Å;

j) forming a barrier layer over said glue layer; said barrier layer composed of TiN or TiW;

k) forming a metal gate stack layer over said barrier layer; said metal gate stack layer composed of W with a thickness of between about 1800 and 2000 Å;

l) chemical-mechanical polishing said metal gate stack layer stopping on said masking layer to form a metal gate stack;

m) forming a protection cap layer on said metal gate stack;

n) removing said barrier layer and said sacrificial layer;

o) performing a LDD Implant by implanting ions into said substrate in said active areas adjacent to said metal gate stack to form LDD regions having a second P-type conductivity type doping;
 (1) the LDD implant performed by implanting BF$_2$ ions at an energy between about 20 and 30 Kev with a dose between about 3E13 and 7E13 atoms/cc; said LDD regions having a depth in a range of between about 0.04 and 0.06 μm;

p) forming a spacer on said sidewall of said metal gate stack;

q) performing a S/D implant to form Source/Drain regions adjacent to said metal gate stack; said source/drain regions having a second p-type conductivity type doping;

r) forming silicide contacts on said Source/Drain regions; and s) forming an interlevel dielectric layer over said substrate.

19. The method of claim 18 wherein said protection cap layer is formed by an oxygen plasma treatment to create said protection cap layer composed of tungsten oxide.

20. The method of claim 18 wherein said protection cap layer formed by depositing a dielectric layer composed of oxynitride or silicon oxide, and chemical-mechanical polishing said dielectric layer.

21. The method of claim 18 wherein said S/D implant performed by implanting $BF_2$ ions at an energy in a range of between about 40 and 50 Kev; and a dose in a range of between about 5E15 and 6E15 atoms/cc; said Source/Drain regions having a depth in a range of between about 0.10 and 0.15 $\mu$m.

* * * * *